United States Patent
Barnett

(10) Patent No.: US 7,888,996 B1
(45) Date of Patent: Feb. 15, 2011

(54) CHOPPER STABILIZED OPERATIONAL AMPLIFIER

(75) Inventor: Raymond Barnett, Farmington, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/606,721

(22) Filed: Oct. 27, 2009

(51) Int. Cl.
*H03F 1/02* (2006.01)

(52) U.S. Cl. .............................. 330/9; 330/69; 327/124

(58) Field of Classification Search ................ 330/9, 330/69; 327/124
See application file for complete search history.

(56) References Cited

U.S. PATENT DOCUMENTS

| | | | | |
|---|---|---|---|---|
| 3,593,580 A | * | 7/1971 | Ludwig et al. ............... | 374/104 |
| 5,180,932 A | * | 1/1993 | Bengel ........................ | 327/362 |
| 5,793,243 A | * | 8/1998 | Farrow ........................ | 327/345 |
| 6,369,743 B2 | * | 4/2002 | Ono ............................ | 341/159 |
| 7,292,095 B2 | | 11/2007 | Burt et al. | |
| 7,446,606 B2 | | 11/2008 | Zhang et al. | |
| 7,605,647 B1 | * | 10/2009 | Romero et al. ................ | 330/9 |
| 7,764,118 B2 | * | 7/2010 | Kusuda et al. ................ | 330/9 |
| 2010/0103015 A1 | * | 4/2010 | Yoshida et al. .............. | 341/143 |

OTHER PUBLICATIONS

"A Micropower Chopper-Stabilized Operational Amplifier Using a SC Notch Filter With Synchronous Integration Inside the Continuous-Time Signal Path," IEEE Journal of Solid-State Cirucits, vol. 41, No. 12, pp. 2729-2736, Dec. 2006 (Rod Burt and Joy Zhang).

* cited by examiner

*Primary Examiner*—Patricia Nguyen
(74) *Attorney, Agent, or Firm*—John J. Patti; Wade J. Brady, III; Frederick J. Telecky, Jr.

(57) ABSTRACT

Chopper stabilized operational amplifiers are in common use. One drawback of these amplifiers, however, is that there is an inherent tone present at the chopper frequency. Conventional circuits have attempted to reduce the effects of this tone by using various filtering schemes, such as a notch filter. Here, however, a track-and-hold circuit is used in conjunction with matched amplifiers to compensate for this tone.

10 Claims, 2 Drawing Sheets

CHOPPER STABILIZED OPERATIONAL AMPLIFIER

TECHNICAL FIELD

The invention relates generally to operational amplifiers and, more particularly, to chopper stabilized operational amplifiers.

BACKGROUND

Chopper stabilized operational amplifiers have been used to reduce both DC offsets and low frequency flicker noise. These amplifiers, traditionally, have the undesirable property of having a large tone at the chopper frequency. Systems to reduce these effects include various forms of filtering. An example of a conventional chopper stabilized operation amplifier 100, using a filter, can be seen in FIG. 1. Amplifier 100 is generally comprised of an input stage 116, amplifiers 106, 112, and 114, notch filter 110, and capacitors C1 through C4. The input stage 116 includes a chopper or mixer 102 and 108 at the input and output of amplifier 104, respectively.

In operation, the mixers 102 and 108 are driven by a clock signal Φ1 to effectively flip the differential signal INM and INP at the input and output substantially simultaneously. From an input signal standpoint, the signal INP and INM does not change polarity with the exception of a small glitch period during the switching of the signal INP and INM. The offset and flicker noise in input stage 116, however, is only flipped at the output, since the offset occurs after the mixer 102. Thus, the offset toggles as the input and the output current from input stage 116 toggles. If the amplifier 104 is coupled through feedback, the net result is the input has a signal that is increased or decreased by the input referred offset. The average of this toggling is zero, and the flicker noise and offset are cancelled.

One drawback, however, is that a ripple tone (due to the toggling) is produced. As this ripple tone is undesirable in some applications, it is filtered. The synchronous notch filter 110 is employed to perform this filtering by using clock signal Φ2, which is orthogonal to clock signal Φ1. Since the input is "toggling" at the offset level (without the notch filter 110) the output current from input stage 116 is also toggling. This output current is integrated to produce the triangle waveform as shown in FIG. 2. Here, the notch filter 110 essentially integrates the upper and lower triangles and sums the values of the integrations (which is then amplified by amplifier 112). Additionally, a feed forward nested miller loop is employed (using amplifiers 106 and 114) to compensate for the delay generated by the notch filter 110.

Some other conventional circuit are: U.S. Pat. No. 7,292, 095; U.S. Pat. No. 7,446,606; Burt et al., "A Micropower Chopper-Stabilized Operational Amplifier Using a SC Notch Filter With Synchronous Integration Inside the Continuous-Time Signal Path," *IEEE Journal of Solid-State Circuits, Vol. 41, No. 12,* pp. 2729-2736, December 2006.

SUMMARY

A preferred embodiment of the present invention, accordingly, provides an apparatus. The apparatus comprises an input stage that receives an differential input signal and a first clock signal; a first amplifier that receives the differential input signal; a track-and-hold (T/H) circuit that is coupled so as to receive a differential output signal from the input stage and that receives a second clock signal, wherein the T/H circuit generates a first signal that corresponds to a positive portion of the differential output signal from the input stage, and wherein the T/H circuit generates a second signal that corresponds to a negative portion of the differential output signal from the input stage; a second amplifier that is coupled to the T/H circuit so as to receive the first signal; a third amplifier that is coupled to the T/H circuit so as to receive the second signal; and a fourth amplifier that is coupled to the first, second, and third amplifiers so as to receive the combined output signals from the first, second, and third amplifiers.

In accordance with a preferred embodiment of the present invention, the input stage further comprises: a first mixer that receives the differential input signal and the first clock signal; a fifth amplifier that is coupled to the mixer so as to receive an output signal from the first mixer; and a second mixer that receives the first clock signal and that is coupled between the fifth mixer and the T/H circuit so as to provide the output signal from the input stage to the T/H circuit.

In accordance with a preferred embodiment of the present invention, the first clock signal and the second clocks signal are non-overlapping.

In accordance with a preferred embodiment of the present invention, the apparatus further comprises a capacitor that is coupled between second mixer and the fourth amplifier.

In accordance with a preferred embodiment of the present invention, the transconductances of the second and third amplifiers are substantially the same.

In accordance with a preferred embodiment of the present invention, an apparatus is provided. The apparatus comprises an input stage having a first input terminal, a second input terminal, a first output terminal, a second output terminal, and a clock terminal, wherein the first input terminal of the input stage receives a positive portion of a differential input signal, and wherein the second input terminal of the input stage receives a second portion of the differential input signal, and wherein the clock terminal of the input stage receives a first clock signal; a first amplifier having a first input terminal, a second input terminal, and an output terminal, wherein the first input terminal of the first amplifier is coupled to the first input terminal of the input stage, and wherein the second input terminal of the first amplifier is coupled to the second input terminal of the input stage; a T/H circuit having a first input terminal, a second input terminal, a first output terminal, a second output terminal, a third output terminal, a fourth output terminal, and a clock terminal, wherein the clock terminal of the T/H circuit receives a second clock signal, and wherein first input terminal of the T/H circuit is coupled to the first output terminal of the input stage, and wherein the second input terminal of the T/H circuit is coupled to the second output terminal of the input stage, and wherein the T/H samples complementary portions of an output signal from the input stage at a plurality of sampling instants; a second amplifier having a first input terminal, a second input terminal, and an output terminal, wherein the first input terminal of the second amplifier is coupled to the first output terminal of the T/H circuit, and wherein the second input terminal of the second amplifier is coupled to the second output terminal of the T/H circuit, and wherein the second amplifier receives one of the complementary portions for each sample from the T/H circuit; a third amplifier having a first input terminal, a second input terminal, and an output terminal, wherein the first input terminal of the third amplifier is coupled to the third output terminal of the T/H circuit, and wherein the second input terminal of the third amplifier is coupled to the fourth output terminal of the T/H circuit, and wherein the third amplifier receives one of the complementary portions for each sample from the T/H circuit; and a fourth amplifier having an input terminal and an output terminal, wherein the input terminal of the fourth amplifier is coupled to the output terminals of the first, second, and third amplifiers.

In accordance with a preferred embodiment of the present invention, the input stage further comprises a first mixer having a first input terminal, a second input terminal, a clock terminal, a first output terminal, and a second output terminal, wherein the first input terminal of the first mixer is coupled to the first input terminal of the input stage, wherein the second input terminal of the first mixer is coupled to the second input terminal of the input stage, and wherein the clock terminal of the first mixer is coupled to the clock terminal of the input stage; a fifth amplifier having a first input terminal, a second input terminal, a first output terminal, and a second output terminal, wherein the first input terminal of the fifth amplifier is coupled to the first output terminal of the first mixer, and wherein the second input terminal of the fifth amplifier is coupled to the second output terminal of the first mixer; and a second mixer having a first input terminal, a second input terminal, a clock terminal, a first output terminal, and a second output terminal, wherein the first input terminal of the second mixer is coupled to the first output terminal of the fifth amplifier, and wherein the second input terminal of the second mixer is coupled to the second output terminal of the fifth amplifier, and wherein the clock terminal of the second mixer is coupled to the clock terminal of the input stage, and wherein the first output terminal of the second mixer is coupled to the first output terminal of the input stage, and wherein the second output terminal of the second mixer is coupled to the second output terminal of the input stage.

In accordance with a preferred embodiment of the present invention, the apparatus further comprises a first capacitor that is coupled between the first output terminal of the input stage and the output terminal of the fourth amplifier; and a second capacitor that is coupled between the second output terminal of the input stage and ground.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
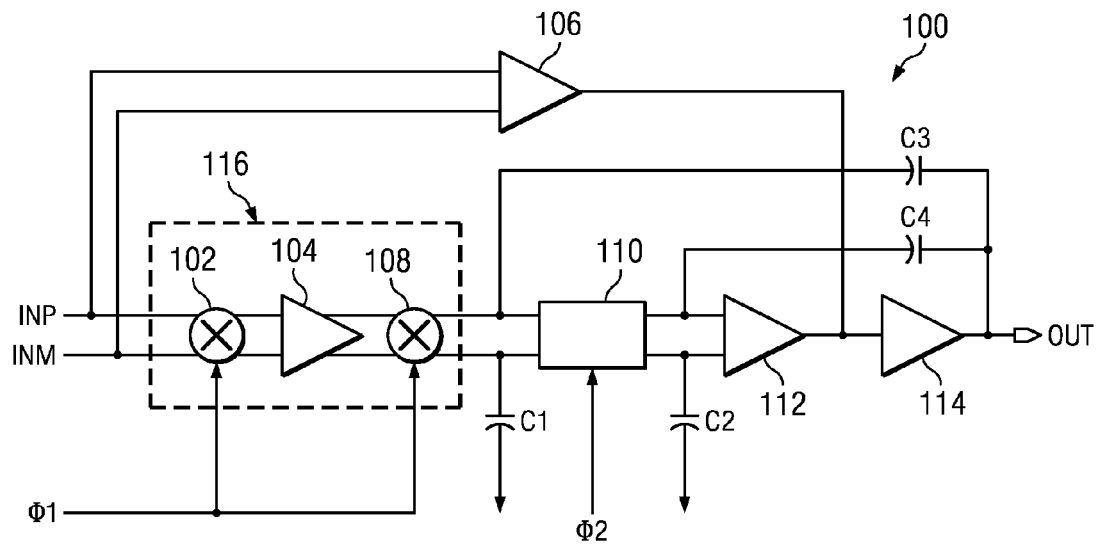
FIG. 1 is an example of a conventional chopper stabilized operational amplifier.
Figure 2:
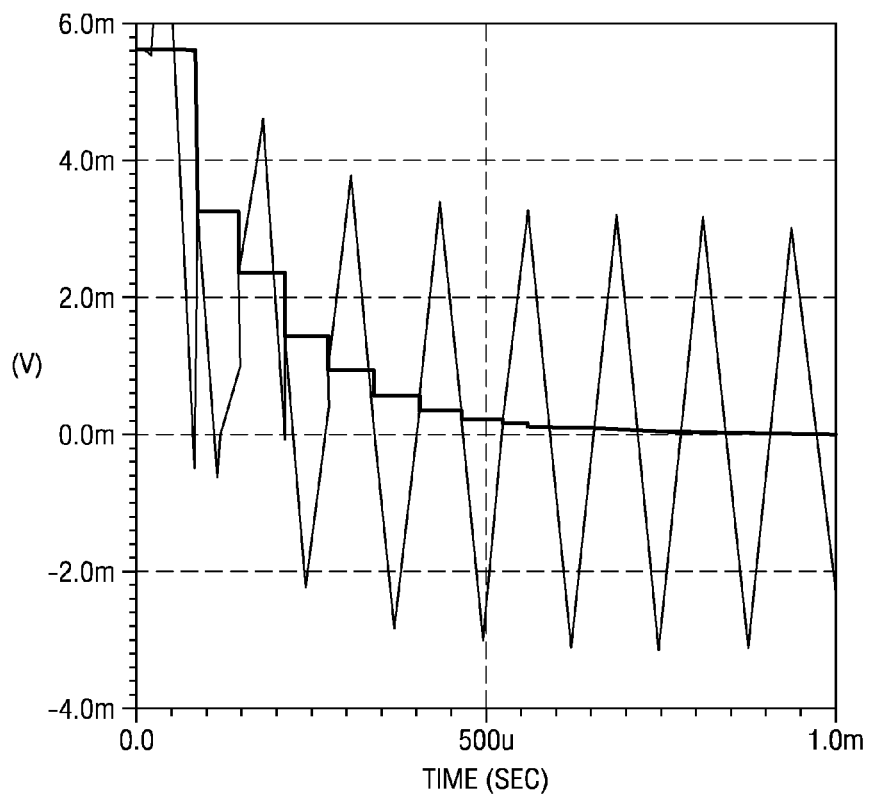
FIG. 2 is diagram depicting a portion of the operation of the amplifier of FIG. 1.

Refer now to the drawings wherein depicted elements are, for the sake of clarity, not necessarily shown to scale and wherein like or similar elements are designated by the same reference numeral through the several views.

Figure 3:
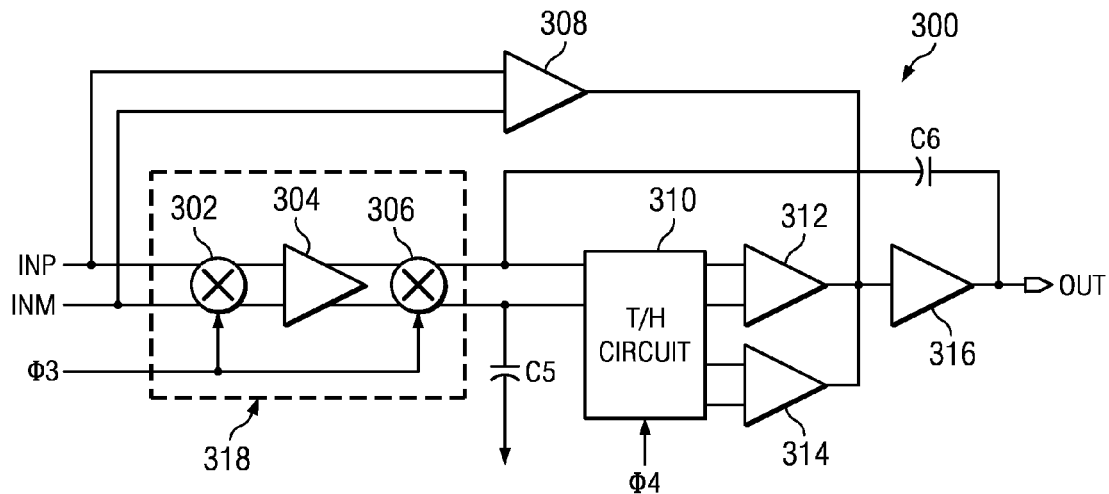
FIG. 3 is an example of a chopper stabilized operational amplifier in accordance with a preferred embodiment of the present invention.

Referring to FIG. 3 of the drawings, the reference numeral 300 generally depicts an example of a chopper stabilized operational amplifier in accordance with a preferred embodiment of the present invention. Amplifier 300 generally comprises an input stage 318 (which generally includes mixers 302 and 306 and amplifier 304), track-and-hold (T/H) circuit 310, amplifiers 308, 312, 314, and 316, and capacitors C5 and C6. Operationally, input stage 318, amplifier 316 and 308, and clock signal $\Phi 3$ have the same general function as input stage 116, amplifiers 114 and 106, and clock signal $\Phi 1$ (respectively) of FIG. 1, so these elements will not be discussed further. A difference, however, is that the notch filter 110 and amplifier 112 of FIG. 1 have been replaced by the T/H circuit 310 and amplifiers 312 and 314 in FIG. 3.

Figure 4:
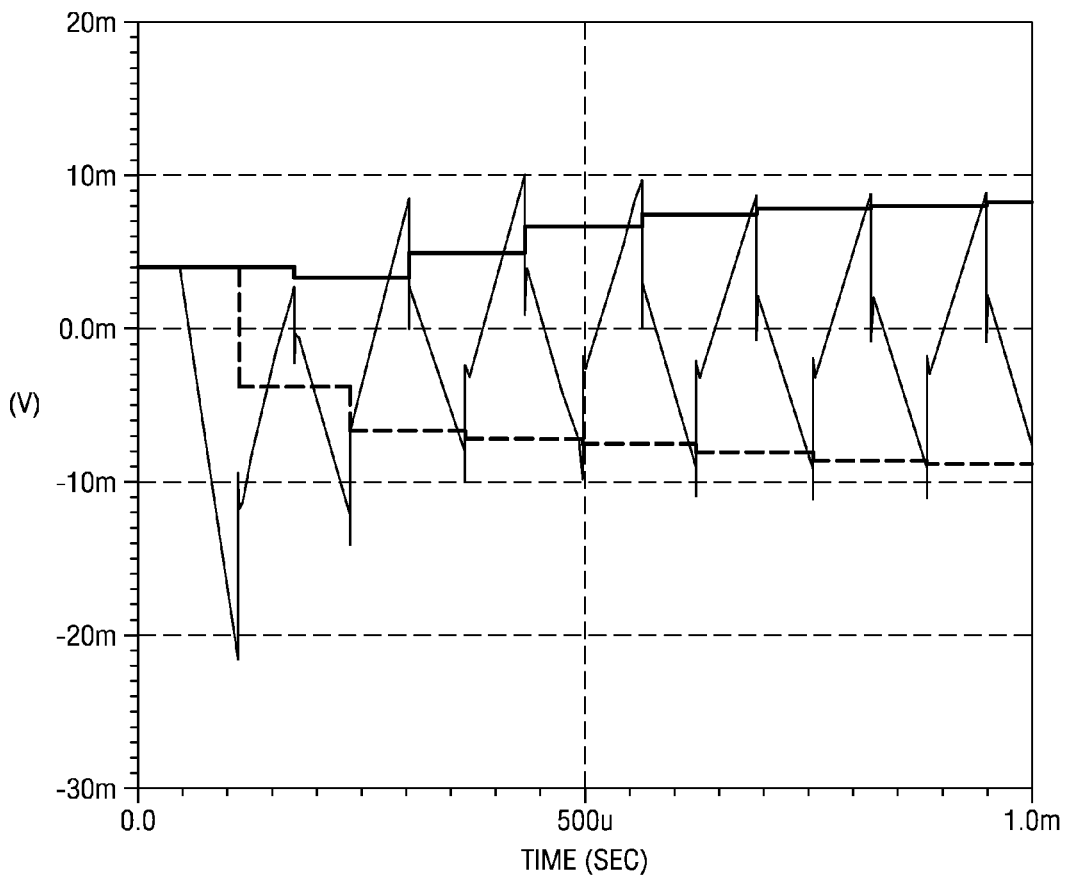
FIG. 4 is a diagram depicting a portion of the operation of the amplifier of FIG. 3.

In operation, the T/H circuit 310 samples the output signal from the input stage 318 at various, predetermined sampling instants determined by clock signal $\Phi 4$. Essentially, (as can be seen in FIG. 4) the T/H circuit 310 samples and integrates complementary positive and negative portions (preferably, at the peaks) of the triangular waveform from the input stage 318. The positive and negative values are held through a full cycle of clock signal $\Phi 3$, indicating that clock signal $\Phi 4$ is not required to be orthogonal to clock signal $\Phi 3$ but is generally non-overlapping. These positive values (or positive signal) and negative values (or negative signal) are output to amplifiers 312 and 314, respectively. Since the transconductance of both amplifiers 312 and 314 are generally the same, the positive and negative values (or signals) cancel one another when summed.

An advantage of this configuration over conventional configurations is that clocks signal $\Phi 3$ and $\Phi 4$ are not required to be orthogonal. Additionally, it may be simpler to implement the T/H circuit 310 and amplifiers 312 and 314 compared to a notch filter, such as notch filter 110.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
an input stage that receives an differential input signal and a first clock signal;
a first amplifier that receives the differential input signal;
a track-and-hold (T/H) circuit that is coupled so as to receive a differential output signal from the input stage and that receives a second clock signal, wherein the T/H circuit generates a first signal that corresponds to a positive portion of the differential output signal from the input stage, and wherein the T/H circuit generates a second signal that corresponds to a negative portion of the differential output signal from the input stage;

a second amplifier that is coupled to the T/H circuit so as to receive the first signal;

a third amplifier that is coupled to the T/H circuit so as to receive the second signal; and a fourth amplifier that is coupled to the first, second, and third amplifiers so as to receive the combined output signals from the first, second, and third amplifiers.

2. The apparatus of claim 1, wherein the input stage further comprises:

a first mixer that receives the differential input signal and the first clock signal;

a fifth amplifier that is coupled to the mixer so as to receive an output signal from the first mixer; and a second mixer that receives the first clock signal and that is coupled between the fifth mixer and the T/H circuit so as to provide the output signal from the input stage to the T/H circuit.

3. The apparatus of claim 2, wherein the first clock signal and the second clocks signal are non-overlapping.

4. The apparatus of claim 3, wherein the apparatus further comprises a capacitor that is coupled between second mixer and the fourth amplifier.

5. The apparatus of claim 1, wherein the transconductances of the second and third amplifiers are substantially the same.

6. An apparatus comprising:

an input stage having a first input terminal, a second input terminal, a first output terminal, a second output terminal, and a clock terminal, wherein the first input terminal of the input stage receives a positive portion of a differential input signal, and wherein the second input terminal of the input stage receives a second portion of the differential input signal, and wherein the clock terminal of the input stage receives a first clock signal;

a first amplifier having a first input terminal, a second input terminal, and an output terminal, wherein the first input terminal of the first amplifier is coupled to the first input terminal of the input stage, and wherein the second input terminal of the first amplifier is coupled to the second input terminal of the input stage;

a T/H circuit having a first input terminal, a second input terminal, a first output terminal, a second output terminal, a third output terminal, a fourth output terminal, and a clock terminal, wherein the clock terminal of the T/H circuit receives a second clock signal, and wherein first input terminal of the T/H circuit is coupled to the first output terminal of the input stage, and wherein the second input terminal of the T/H circuit is coupled to the second output terminal of the input stage, and wherein the T/H samples complementary portions of an output signal from the input stage at a plurality of sampling instants;

a second amplifier having a first input terminal, a second input terminal, and an output terminal, wherein the first input terminal of the second amplifier is coupled to the first output terminal of the T/H circuit, and wherein the second input terminal of the second amplifier is coupled to the second output terminal of the T/H circuit, and wherein the second amplifier receives one of the complementary portions for each sample from the T/H circuit;

a third amplifier having a first input terminal, a second input terminal, and an output terminal, wherein the first input terminal of the third amplifier is coupled to the third output terminal of the T/H circuit, and wherein the second input terminal of the third amplifier is coupled to the fourth output terminal of the T/H circuit, and wherein the third amplifier receives one of the complementary portions for each sample from the T/H circuit; and a fourth amplifier having an input terminal and an output terminal, wherein the input terminal of the fourth amplifier is coupled to the output terminals of the first, second, and third amplifiers.

7. The apparatus of claim 6, wherein the input stage further comprises:

a first mixer having a first input terminal, a second input terminal, a clock terminal, a first output terminal, and a second output terminal, wherein the first input terminal of the first mixer is coupled to the first input terminal of the input stage, wherein the second input terminal of the first mixer is coupled to the second input terminal of the input stage, and wherein the clock terminal of the first mixer is coupled to the clock terminal of the input stage;

a fifth amplifier having a first input terminal, a second input terminal, a first output terminal, and a second output terminal, wherein the first input terminal of the fifth amplifier is coupled to the first output terminal of the first mixer, and wherein the second input terminal of the fifth amplifier is coupled to the second output terminal of the first mixer; and a second mixer having a first input terminal, a second input terminal, a clock terminal, a first output terminal, and a second output terminal, wherein the first input terminal of the second mixer is coupled to the first output terminal of the fifth amplifier, and wherein the second input terminal of the second mixer is coupled to the second output terminal of the fifth amplifier, and wherein the clock terminal of the second mixer is coupled to the clock terminal of the input stage, and wherein the first output terminal of the second mixer is coupled to the first output terminal of the input stage, and wherein the second output terminal of the second mixer is coupled to the second output terminal of the input stage.

8. The apparatus of claim 7, wherein the first clock signal and the second clocks signal are non-overlapping.

9. The apparatus of claim 6, wherein the apparatus further comprises:

a first capacitor that is coupled between the first output terminal of the input stage and the output terminal of the fourth amplifier; and a second capacitor that is coupled between the second output terminal of the input stage and ground.

10. The apparatus of claim 1, wherein the transconductances of the second and third amplifiers are substantially the same.

* * * * *